United States Patent
Zhen et al.

(10) Patent No.: US 6,835,631 B1
(45) Date of Patent: Dec. 28, 2004

(54) METHOD TO ENHANCE INDUCTOR Q FACTOR BY FORMING AIR GAPS BELOW INDUCTORS

(75) Inventors: Zheng Jia Zhen, Singapore (SG); Sanford Chu, Singapore (SG); Ng Chit Hwei, Singapore (SG); Lap Chan, Singapore (SG); Purakh Raj Verma, Singapore (SG)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 10/718,193

(22) Filed: Nov. 20, 2003

(51) Int. Cl.[7] .............................................. H01L 21/20
(52) U.S. Cl. ...................... 438/381; 438/421; 438/422
(58) Field of Search ........................ 438/381, 421–422

(56) References Cited

U.S. PATENT DOCUMENTS

| | | | |
|---|---|---|---|
| 4,634,494 A | 1/1987 | Taji et al. ................. | 156/628 |
| 5,742,091 A | 4/1998 | Hebert ...................... | 257/531 |
| 6,180,995 B1 | 1/2001 | Hebert ...................... | 257/531 |
| 6,287,979 B1 | 9/2001 | Zhou et al. ................ | 438/723 |
| 6,303,423 B1 | 10/2001 | Lin .......................... | 438/238 |
| 6,307,247 B1 | 10/2001 | Davies ...................... | 257/522 |
| 6,495,903 B2 * | 12/2002 | Xu et al. ................... | 257/531 |

* cited by examiner

*Primary Examiner*—Luan Thai
(74) *Attorney, Agent, or Firm*—George O. Saile; Rosemary L. S. Pike; Stephen G. Stanton

(57) ABSTRACT

A method of enhancing inductor performance comprising the following steps. A structure having a first oxide layer formed thereover is provided. A lower low-k dielectric layer is formed over the first oxide layer. A second oxide layer is formed over the lower low-k dielectric layer. The second oxide layer is patterned to form at least one hole there through exposing a portion of the lower low-k dielectric layer. Etching through the exposed portion of the lower low-k dielectric layer and into the lower low-k dielectric layer to from at least one respective air gap within the etched lower low-k dielectric layer. An upper low-k dielectric layer is formed over the patterned second oxide layer. At least one inductor is formed within the upper low-k dielectric layer and over the at least one air gap whereby the performance of the inductor is enhanced.

63 Claims, 2 Drawing Sheets

METHOD TO ENHANCE INDUCTOR Q FACTOR BY FORMING AIR GAPS BELOW INDUCTORS

FIELD OF THE INVENTION

The present invention relates generally to fabrication of semiconductor devices, and more specifically to methods of enhancing the performance of inductors.

BACKGROUND OF THE INVENTION

The quality factor (Q factor) is affected by capacitance loss due to coupling to underlying metals and substrate loss due to eddy current.

U.S. Pat. No. 6,180,995 B1 to Herbert describes an air gap under a field oxide under inductors.

U.S. Pat. No. 6,307,247 B1 to Davies describes an inductor process with low-k layers.

U.S. Pat. No. 6,287,979 B1 to Zhou et al. describes an air gap process between conductive lines.

U.S. Pat. No. 4,634,494 to Taji et al. describes a process to selectively etch a doped oxide layer.

U.S. Pat. No. 5,742,091 to Hébert describes a semiconductor device within which parasitic capacitances are minimized and a method of fabricating same.

U.S. Pat. No. 6,303,423 to Lin describes a method for forming high performance system-on-chip using post passivation process.

SUMMARY OF THE INVENTION

Accordingly, it is an object of the present invention to provide improved methods of fabricating inductor devices with reduced capacitance loss.

Other objects will appear hereinafter.

It has now been discovered that the above and other objects of the present invention may be accomplished in the following manner. Specifically, a structure having a first oxide layer formed thereover is provided. A lower low-k dielectric layer is formed over the first oxide layer. A second oxide layer is formed over the lower low-k dielectric layer. The second oxide layer is patterned to form at least one hole there through exposing a portion of the lower low-k dielectric layer. Etching through the exposed portion of the lower low-k dielectric layer and into the lower low-k dielectric layer to from at least one respective air gap within the etched lower low-k dielectric layer. An upper low-k dielectric layer is formed over the patterned second oxide layer. At least one inductor is formed within the upper low-k dielectric layer and over the at least one air gap whereby the performance of the inductor is enhanced.

DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Initial Structure

Figure 1:
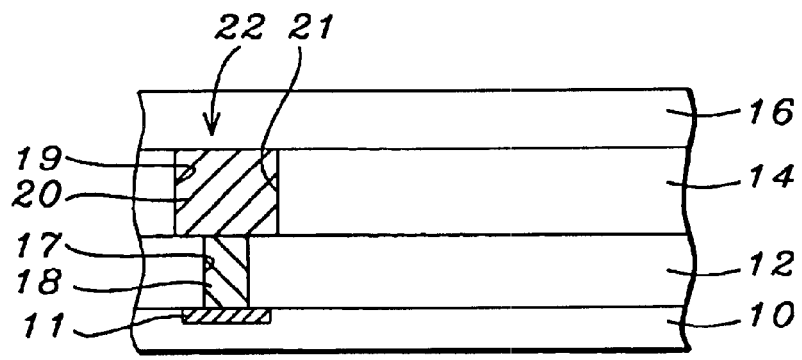
FIGS. 1 to 5 schematically illustrate in cross-sectional representation a preferred embodiment of the present invention.

FIG. 1 illustrates a cross-sectional view of a structure 10 that is preferably a silicon (Si), germanium (Ge), gallium arsenide (GaAs), or any compounded semiconductor or polymeric material substrate, is more preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Structure 10 may include several levels of metal interconnects with an uppermost exposed metal interconnect 11.

A first oxide layer 12 is formed over structure 10 to a thickness of preferably from about 1000 Å to 5 µm and may be from about 3000 to 6000 Å. First oxide layer 10 is preferably comprised of silicon oxide ($SiO_2$), doped silicon oxide, BPSG, FSG, silicon carbide (SiC), Coral™, Black Diamond™, SiN or TEOS and is more preferably silicon oxide ($SiO_2$).

A via opening 17 is formed within first oxide layer 12 and a planarized metal plug 18 is formed within via opening 17.

A low-k dielectric layer 14 is formed over first oxide layer 12 and metal plug 18 to a thickness of preferably from about 1000 to 10,000 Å and more preferably from about 2000 to 6000 Å. Low-k dielectric layer 14 is preferably comprised of silicon oxide ($SiO_2$), boron-doped silicon oxide, phosphorous-doped silicon oxide, BPSG, FSG, SiN or carbon doped silicon oxide such as Coral™ or Black Diamond™ and is more preferably carbon-doped silicon oxide.

A trench opening 19 is formed within low-k dielectric layer 14 and a planarized metal structure 20 is formed within trench opening 19. Metal plug 18 and metal structure 20 comprise a dual damascene structure 22 and is preferably comprised of copper (Cu), tungsten (W), aluminum (Al), tantalum (Ta) or tantalum nitride (TaN) and is more preferably copper.

A second oxide layer 16 is formed over low-k dielectric layer 14 and metal structure 20 to a thickness of preferably from about 1000 to 10,000 Å and more preferably from about 4000 to 8000 Å. Second oxide layer 16 is preferably comprised of silicon oxide ($SiO_2$), doped silicon oxide, BPSG, FSG, Coral™, Black Diamond™, SiN or silicon carbide (SiC) and is more preferably silicon oxide ($SiO_2$).

Formation of Holes 24,26

Figure 2:
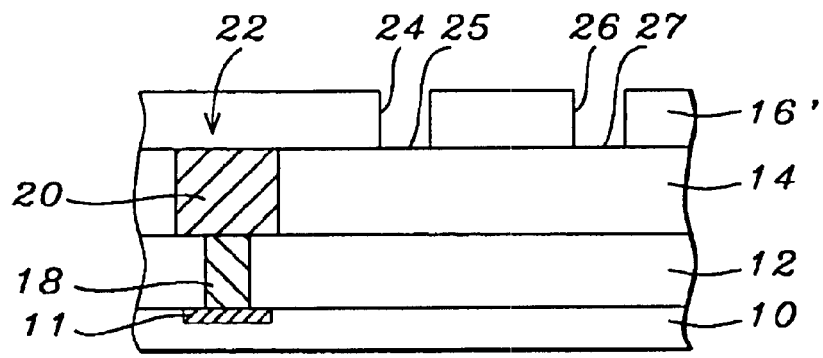

As shown in FIG. 2, one or more holes 24, 26 are formed through second oxide layer 16 preferably using a dry etch, a wet etch or a combination wet/dry etch and more preferably a dry etch. Holes 24, 26 have a width of preferably from about 1.0 to 10.0 µm and more preferably from about 2.0 to 6.0 µm and expose portions 25, 27 of low-k dielectric layer 14.

Holes 24, 26 may be formed by, for example, forming a patterned masking layer (not shown) over the second oxide layer 16 and then using the patterned masking layer as a mask to etch holes 24, 26. The patterned masking layer may be comprised of, for example, a photoresist layer.

Formation of Lower Air Gaps 28,30

Figure 3:
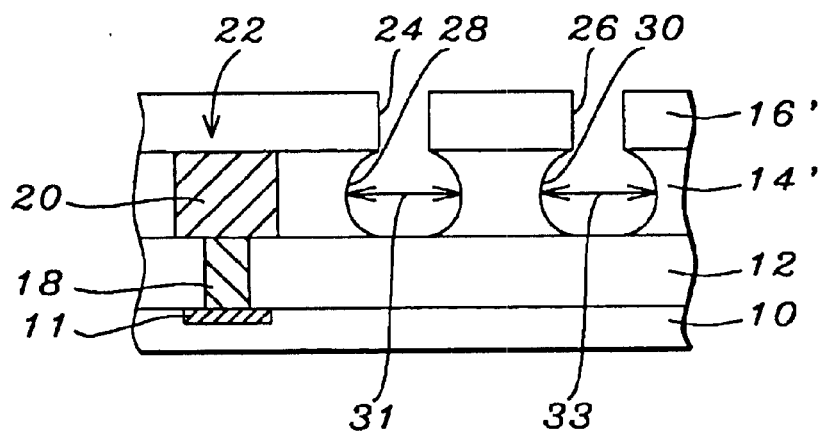

As shown in FIG. 3, a solvent etch is used to etch low-k dielectric layer 14 through the exposed portions 25, 27 of low-k dielectric layer 14 to form respective air gaps 28, 39 within etched low-k dielectric layer 14'. The solvent etch is selected to have a second/first oxide layer 16/12: low-k dielectric layer 14 etch selectivity of preferably about 1 to 10 and more preferably from about 1:50 to 1:100 so that only low-k dielectric layer 14 is appreciably affected by the solvent etch. This obviates the need to have a patterned mask layer formed over etched second oxide layer 16' before the solvent etching of low-k dielectric layer 14.

Air gaps 28, 39 have respective diameters 31, 33 of preferably from about 100.0 to 500.0 µm and more preferably from about 200.0 to 400.0 µm.

Formation of Upper Low-k Dielectric Layer 32

Figure 4:
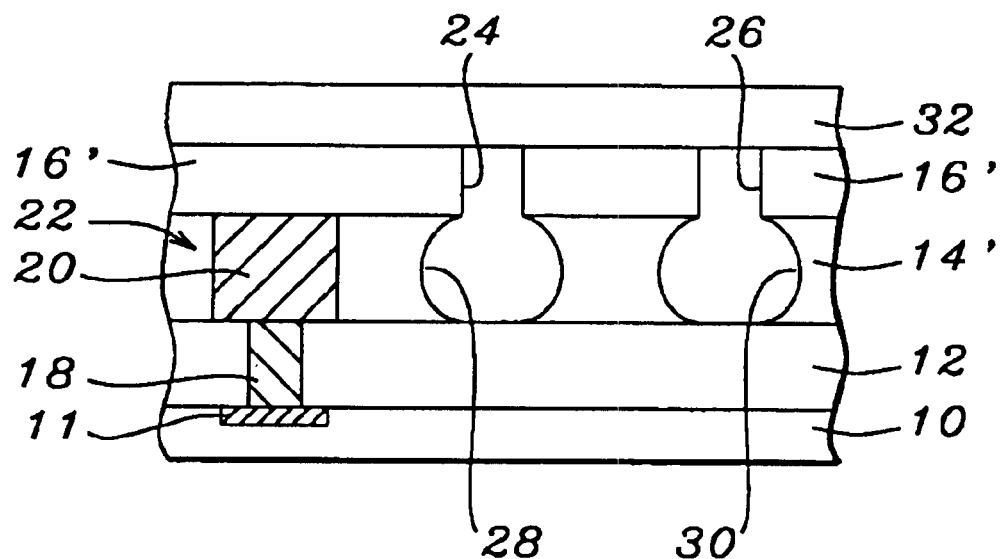

As shown in FIG. 4, an upper low-k dielectric layer 32 is formed over etched second oxide layer 16, sealing holes 24, 26 and thus air gaps 28, 30. Upper low-k dielectric layer 32 has a thickness of preferably from about 0.1 to 10.0 µm and more preferably from about 2.0. to 5.0 µm. Upper low-k dielectric layer 32 is preferably comprised of silicon oxide, TEOS, SiC, SiN, FSG, BPSG or carbon-doped silicon oxide such as Coral™ or Black Diamond™ and is more preferably FSG.

Formation of Inductor 34

Figure 5:
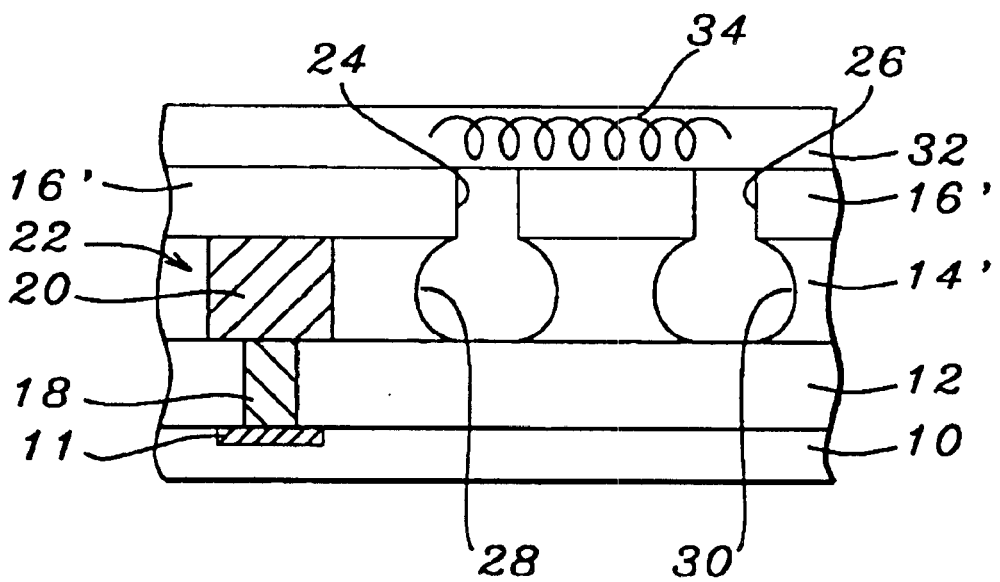

As shown in FIG. 5, an inductor 34 is formed within upper low-k dielectric layer 32 over air gap(s) 28, 30. The presence of air gaps 28, 30 decreases the dielectric constant (k) of the material underlying the inductor 34 and therefore decreases: (1) the capacitance loss of the inductor 34 due to coupling to underlying metal layers, i.e., e.g. dual damascene structure 22 as illustrated in the Figures; and (2) the substrate loss due to eddy current. This enhances the inductor 34.

Such eddy currents are closed loops of induced current circulating in planes perpendicular to the magnetic flux. They normally travel parallel to the coil's winding and the flow is limited to the area of the inducing magnetic filed. Eddy currents concentrate near the surface adjacent to a coil and their strength decreases with the distance from the coil as shown in the image. Eddy current density decreased exponentially with depth.

It is noted that only one, or more than two air gaps 28, 30 may be formed within low-k dielectric layer 14 so that any inductors 34 formed within upper low-k dielectric layer 32 are formed over the air gaps 28, 30 so formed.

It is also noted that the air-gap(s) 28, 30 and the inductor 34 can be at any relative layers. For example, the 'first oxide layer 12' may be from M1 through M6 with the air gap(s) 28, 30 and the inductor 34 at M7 and M8, respectively. Thus, a thick 'first oxide layer 12' is given.

Advantages of the Invention

The advantages of one or more embodiments of the present invention include:

1) the reduction of coupling with the substrate thereby enhancing the quality factor of the metal inductors formed in accordance with the present invention; and
2) the method of the present invention can be integrated with any back-end-of line (BEOL) technologies, regardless of whether Cu or Al is implemented.

While particular embodiments of the present invention have been illustrated and described, it is not intended to limit the invention, except as defined by the following claims.

We claim:

1. A method of enhancing inductor performance, comprising the steps of:
   providing a structure having a first oxide layer formed thereover;
   forming a lower low-k dielectric layer over the first oxide layer;
   forming a second oxide layer over the lower low-k dielectric layer;
   patterning the second oxide layer to form at least one hole there through exposing a portion of the lower low-k dielectric layer;
   etching through the exposed portion of the lower low-k dielectric layer and into the lower low-k dielectric layer to from at least one respective air gap within the etched lower low-k dielectric layer;
   forming an upper low-k dielectric layer over the patterned second oxide layer; and
   forming at least one inductor within the upper low-k dielectric layer and over the at least one air gap whereby the performance of the at least one inductor is enhanced.

2. The method of claim 1, wherein the structure is silicon, germanium, gallium arsenide, any compounded semiconductor or a polymeric material.

3. The method of claim 1, wherein the structure is comprised of silicon.

4. The method of claim 1, wherein the structure includes one or more levels of metal interconnects with an uppermost exposed metal interconnect.

5. The method of claim 1, wherein the first oxide layer has a thickness of from about 1000 Å to 5 µm; the lower low-k layer has a thickness of from about 1000 to 10,000 Å and the second oxide layer has a thickness of from about 1000 to 10,000 Å.

6. The method of claim 1, wherein the first oxide layer has a thickness of from about 3000 to 6000 Å; the lower low-k layer has a thickness of from about 2000 to 6000 Å and the second oxide layer has a thickness of from about 4000 to 8000 Å.

7. The method of claim 1, wherein the upper low-k dielectric layer has a thickness of from about 0.1 to 10.0 µm.

8. The method of claim 1, wherein the upper low-k dielectric layer has a thickness of from about 2.0. to 5.0 µm.

9. The method of claim 1, wherein the first oxide layer is comprised of silicon oxide, doped silicon oxide, BPSG, FSG, silicon carbide (SiC), Coral™, Black Diamond™, SiN or TEOS; the lower low-k dielectric layer is comprised of silicon oxide, boron-doped silicon oxide, phosphorous-doped silicon oxide, BPSG, FSG, SiN or carbon doped silicon oxide such as Coral™ or Black Diamond™ and the upper oxide layer is comprised of silicon oxide, doped silicon oxide, BPSG, FSG, Coral™, Black Diamond™, SiN or silicon carbide (SiC).

10. The method of claim 1, wherein the first oxide layer is comprised of silicon oxide; the lower low-k dielectric layer is comprised of carbon-doped silicon oxide and the upper oxide layer is comprised of silicon oxide.

11. The method of claim 1, wherein the upper low-k dielectric layer is comprised of silicon oxide, TEOS, SiC, SiN, FSG, BPSG, carbon-doped silicon oxide, Coral™ or Black Diamond™.

12. The method of claim 1, wherein the upper low-k dielectric layer is comprised of FSG.

13. The method of claim 1, including the step of forming a dual damascene structure within the first oxide layer and the lower low-k dielectric layer proximate the at least one air gap before formation of the at least one air gap.

14. The method of claim 1, wherein two or more air gaps are formed.

15. The method of claim 1, wherein two or more inductors are formed over the air gap.

16. The method of claim 1, wherein two or more air gaps are formed and two or more inductors are formed over the two or more air gaps.

17. The method of claim 1, wherein the at least one hole has a diameter of from about 1.0 to 10.0 µm and the at least one air gap has a diameter of from about 100.0 to 500.0 µm.

18. The method of claim 1, wherein the hole has a diameter of from about 2.0 to 6.0 µm and the air gap has a diameter of from about 200.0 to 400.0 µm.

19. The method of claim 1, wherein the lower low-k dielectric layer is etched using an etch selected from the group consisting of: a dry etch, a wet etch and a combination wet and dry etch.

20. The method of claim 1, wherein the lower low-k dielectric layer is etched using a dry etch.

21. The method of claim 1, wherein the lower low-k dielectric layer is etched using an etch having an oxide: lower low-k dielectric selectivity of about 1:10.

22. The method of claim 1, wherein the lower low-k dielectric layer 14 is etched using an etch having an oxide: lower low-k dielectric selectivity of from about 1:50 to 1:100.

23. The method of claim 1, wherein the performance of the inductor is enhanced by lowering the capacitance loss of the inductor.

24. The method of claim 1, wherein the performance of the inductor is enhanced by lowering the substrate loss due to eddy currents.

25. The method of claim 1, wherein the performance of the inductor is enhanced by lowering the capacitance loss of the inductor and by lowering the substrate loss due to eddy currents.

26. A method of enhancing inductor performance, comprising the steps of:
providing a structure having a first oxide layer formed thereover to a thickness of from about 1000 Å to 5 µm;
forming a lower low-k dielectric layer over the first oxide layer to a thickness of from about 1000 to 10,000 Å;
forming a second oxide layer over the lower low-k dielectric layer to a thickness of from about 1000 to 10,000 Å;
patterning the second oxide layer to form one or more holes there through exposing one or more respective portions of the lower low-k dielectric layer;
etching through the one or more exposed portions of the lower low-k dielectric layer and into the lower low-k dielectric layer to from one or more respective air gaps within the etched lower low-k dielectric layer;
forming an upper low-k dielectric layer over the patterned second oxide layer; and
forming one or more inductors within the upper low-k dielectric layer and over the one or more air gaps whereby the performance of the one or more inductors is enhanced.

27. The method of claim 26, wherein the structure is comprised of silicon, germanium, gallium arsenide, any compounded semiconductor or a polymeric material.

28. The method of claim 26, wherein the structure is comprised of silicon.

29. The method of claim 26, wherein the structure includes one or more levels of metal interconnects with an uppermost exposed metal interconnect.

30. The method of claim 26, wherein the first oxide layer has a thickness of from about 3000 to 6000 Å; the lower low-k layer has a thickness of from about 2000 to 6000 Å and the second oxide layer has a thickness of from about 4000 to 8000 Å.

31. The method of claim 26, wherein the upper low-k dielectric layer has a thickness of from about 0.1 to 10.0 µm.

32. The method of claim 26, wherein the upper low-k dielectric layer has a thickness of from about 2.0. to 5.0 µm.

33. The method of claim 26, wherein the first oxide layer is comprised of silicon oxide, doped silicon oxide, BPSG, FSG, silicon carbide (SiC), Coral™, Black Diamond™, SiN or TEOS; the lower low-k dielectric layer is comprised of silicon oxide, boron-doped silicon oxide, phosphorous-doped silicon oxide, BPSG, FSG, SiN or carbon doped silicon oxide such as Coral™ or Black Diamond™ and the upper oxide layer is comprised of silicon oxide, doped silicon oxide, BPSG, FSG, Coral™, Black Diamond™, SiN or silicon carbide (SiC).

34. The method of claim 26, wherein the first oxide layer is comprised of silicon oxide; the lower low-k dielectric layer is comprised of carbon-doped silicon oxide and the upper oxide layer is comprised of silicon oxide.

35. The method of claim 26, wherein the upper low-k dielectric layer is comprised of silicon oxide, TEOS, SiC, SiN, FSG, BPSG, carbon-doped silicon oxide, Coral™ or Black Diamond™.

36. The method of claim 26, wherein the upper low-k dielectric layer is comprised of FSG.

37. The method of claim 26, including the step of forming a dual damascene structure within the first oxide layer and the lower low-k dielectric layer proximate the one or more air gaps before formation of the one or more air gaps.

38. The method of claim 26, wherein the one or more holes have respective diameters of from about 1.0 to 10.0 µm and the one or more air gaps have respective diameters of from about 100.0 to 500.0 µm.

39. The method of claim 26, wherein the one or more holes have respective diameters of from about 2.0 to 6.0 µm and the one or more air gaps have respective diameters of from about 200.0 to 400.0 µm.

40. The method of claim 26, wherein the lower low-k dielectric layer is etched using an etch selected from the group consisting of: a dry etch, a wet etch and a combination dry and wet etch.

41. The method of claim 26, wherein the lower low-k dielectric layer is etched using a dry etch.

42. The method of claim 26, wherein the lower low-k dielectric layer is etched using an etch having an oxide: lower low-k dielectric selectivity of about 1:10.

43. The method of claim 26, wherein the lower low-k dielectric layer is etched using an etch having an oxide-:lower low-k dielectric selectivity of from about 1:50 to 1:100.

44. The method of claim 26, wherein the performance of the one or more inductors is enhanced by lowering the capacitance loss of the one or more inductors.

45. The method of claim 26, wherein the performance of the one or more inductors is enhanced by lowering the substrate loss due to eddy currents.

46. A method of enhancing inductor performance, comprising the steps of:
providing a structure having a first oxide layer formed thereover;
forming a lower low-k dielectric layer over the first oxide layer;
forming a second oxide layer over the lower low-k dielectric layer;
patterning the second oxide layer to form one or more holes there through exposing one or more respective portions of the lower low-k dielectric layer;
etching through the one or more exposed portions of the lower low-k dielectric layer and into the lower low-k dielectric layer to from one or more respective air gaps within the etched lower low-k dielectric layer; the one or more air gaps having respective diameters of from about 100.0 to 500.0 µm;
forming an upper low-k dielectric layer over the patterned second oxide layer; and
forming one or more inductors within the upper low-k dielectric layer and over the one or more air gaps whereby the performance of the one or more inductors is enhanced.

47. The method of claim 46, wherein the first oxide layer has a thickness of from about 1000 Å to 5 µm; the lower low-k layer has a thickness of from about 1000 to 10,000 Å and the second oxide layer has a thickness of from about 1000 to 10,000 Å.

48. The method of claim 46, wherein the first oxide layer has a thickness of from about 3000 to 6000 Å; the lower low-k layer has a thickness of from about 2000 to 6000 Å and the second oxide layer has a thickness of from about 4000 to 8000 Å.

49. The method of claim 46, wherein the upper low-k dielectric layer has a thickness of from about 0.1 to 10.0 µm.

50. The method of claim 46, wherein the upper low-k dielectric layer has a thickness of from about 2.0. to 5.0 µm.

51. The method of claim 46, wherein the first oxide layer is comprised of silicon oxide, doped silicon oxide, BPSG, FSG, silicon carbide (SiC), Coral™, Black Diamond™, SiN or TEOS; the lower low-k dielectric layer is comprised of silicon oxide, boron-doped silicon oxide, phosphorous-doped silicon oxide, BPSG, FSG, SiN or carbon doped silicon oxide such as Coral™ or Black Diamond™ and the upper oxide layer is comprised of silicon oxide, doped silicon oxide, BPSG, FSG, Coral™, Black Diamond™, SiN or silicon carbide (SiC).

52. The method of claim 46, wherein the first oxide layer is comprised of silicon oxide; the lower low-k dielectric layer is comprised of carbon-doped silicon oxide and the upper oxide layer is comprised of silicon oxide.

53. The method of claim 46, wherein the upper low-k dielectric layer is comprised of silicon oxide, TEOS, SiC, SiN, FSG, BPSG, carbon-doped silicon oxide, Coral™ or Black Diamond™.

54. The method of claim 46, wherein the upper low-k dielectric layer is comprised of FSG.

55. The method of claim 46, including the step of forming a dual damascene structure within the first oxide layer and the lower low-k dielectric layer proximate the one or more air gaps before formation of the one or more air gaps.

56. The method of claim 46, wherein the one or more holes have respective diameters of from about 1.0 to 10.0 µm.

57. The method of claim 46, wherein the one or more holes have respective diameters of from about 2.0 to 6.0 µm and the one or more air gaps have respective diameters of from about 200.0 to 400 µm.

58. The method of claim 46, wherein the lower low-k dielectric layer is etched using an etch selected from the group consisting of: a dry etch, a wet etch and a combination wet and dry etch.

59. The method of claim 46, wherein the lower low-k dielectric layer is etched using a dry etch.

60. The method of claim 46, wherein the lower low-k dielectric layer is etched using an etch having an oxide-:lower low-k dielectric selectivity of about 1:10.

61. The method of claim 46, wherein the lower low-k dielectric layer is etched using an etch having an oxide-:lower low-k dielectric selectivity of from about 1:50 to 1:100.

62. The method of claim 46, wherein the performance of the one or more inductors is enhanced by lowering the capacitance loss of the one or more inductors.

63. The method of claim 46, wherein the performance of the one or more inductors is enhanced by lowering the substrate loss due to eddy currents.

* * * * *

UNITED STATES PATENT AND TRADEMARK OFFICE
CERTIFICATE OF CORRECTION

PATENT NO. : 6,835,631 B1
DATED : December 28, 2004
INVENTOR(S) : Jia Zhen Zheng et al.

It is certified that error appears in the above-identified patent and that said Letters Patent is hereby corrected as shown below:

Title page,
Item [75], Inventors, delete "Zheng Jia Zhen, Singapore (SG)", and replace with -- Jia Zhen Zheng, Singapore (SG) --, delete "Ng Chit Hwei, Singapore (SG)", and replace with -- Chit Hwei Ng, Singapore (SG) --, delete "Purakh Raj Verma, Singapore (SG)" and replace with -- Raj Verma Purakh, Singapore (SG) --.

Signed and Sealed this

Twenty-sixth Day of April, 2005

JON W. DUDAS
*Director of the United States Patent and Trademark Office*